United States Patent
Kato et al.

(10) Patent No.: US 8,071,212 B2
(45) Date of Patent: Dec. 6, 2011

(54) SELF-ADHESIVE FILM

(75) Inventors: Junichi Kato, Fujinomiya (JP); Minoru Nakahara, Fujinomiya (JP); Shinichi Hashimoto, Fujinomiya (JP); Masanori Maruno, Kashiba (JP); Katsumi Horikawa, Kashiba (JP)

(73) Assignee: Panac Co., Ltd., Tokyo (JP)

( * ) Notice: Subject to any disclaimer, the term of this patent is extended or adjusted under 35 U.S.C. 154(b) by 776 days.

(21) Appl. No.: 11/630,968

(22) PCT Filed: Feb. 22, 2005

(86) PCT No.: PCT/JP2005/003244
§ 371 (c)(1),
(2), (4) Date: Mar. 16, 2007

(87) PCT Pub. No.: WO2006/006265
PCT Pub. Date: Jan. 19, 2006

(65) Prior Publication Data
US 2007/0275200 A1    Nov. 29, 2007

(30) Foreign Application Priority Data

Jul. 14, 2004  (JP) ................................ 2004-207513
Jul. 14, 2004  (JP) ................................ 2004-207514

(51) Int. Cl.
*B32B 7/12*    (2006.01)
(52) U.S. Cl. ........................................ 428/343; 428/354
(58) Field of Classification Search .................. 428/343
See application file for complete search history.

(56) References Cited

U.S. PATENT DOCUMENTS

| | | | | |
|---|---|---|---|---|
| 4,628,072 A * | 12/1986 | Shiraki et al. | ................... | 525/57 |
| 6,214,476 B1 | 4/2001 | Ikeda et al. | | |
| 6,416,858 B1 * | 7/2002 | Ercillo et al. | ................. | 428/345 |
| 6,663,957 B1 * | 12/2003 | Takushima et al. | ....... | 428/355 R |
| 6,787,236 B2 * | 9/2004 | Kimura et al. | ................ | 428/412 |
| 2002/0037413 A1 * | 3/2002 | Kishioka et al. | .............. | 428/412 |
| 2003/0059563 A1 * | 3/2003 | Bourdelais et al. | .......... | 428/40.1 |

FOREIGN PATENT DOCUMENTS

| | | | |
|---|---|---|---|
| JP | 05263052 | * | 12/1993 |
| JP | A 7-026212 | | 1/1995 |
| JP | A 8-081616 | | 3/1996 |
| JP | A 8-245938 | | 9/1996 |
| JP | A 10-265756 | | 10/1998 |
| JP | A 10-286870 | | 10/1998 |
| JP | A 2001-139898 | | 5/2001 |
| JP | 2001348561 | * | 12/2001 |
| JP | A 2001-348561 | | 12/2001 |
| JP | A 2003-524197 | | 8/2003 |
| JP | 2004231694 | * | 8/2004 |
| JP | A 2004-217749 | | 8/2004 |
| JP | A 2004-231694 | | 8/2004 |
| JP | A 2006-2064 | | 1/2006 |

OTHER PUBLICATIONS

JP2004231694, Inoue Isao, Dec. 18, 2001, Machine translation attached.*
JP 2001348561, Kato et al., Aug. 19, 2004, Machine translation attached.*
Wypych George, Handbook of plasticizer, no month 2004, 2nd edition.*
Basic physical properties of plasticizers, Table: Interactive table, 2nd electronic edition, no month—2004.*
Machine translation of 1993-263052 (1993).*

* cited by examiner

*Primary Examiner* — Callie Shosho
*Assistant Examiner* — Samir Shah
(74) *Attorney, Agent, or Firm* — Oliff & Berridge, PLC

(57) ABSTRACT

A self-adhesive film comprises a substrate layer and an adhesive layer on the substrate layer, which comprises a carboxylic acid-modified thermoplastic elastomer, a carboxylic acid-unmodified thermoplastic elastomer, a crosslinking agent and a plasticizer. A self-adhesive functional film comprises a substrate layer, an adhesive layer formed on one side of the substrate layer, and a functional layer on the other side of the substrate layer which has at least one of antireflective, electromagnetic wave blocking, heat ray cutting off, antistatic, anticlauding, antibacterial, deodorizing easy-adhering, antifouling functions and hard coat layer.

7 Claims, No Drawings

SELF-ADHESIVE FILM

TECHNICAL FIELD

The present invention relates to a self-adhesive film and a self-adhesive functional film, which can be used for protecting display screens of TV sets, personal computers, mobile-phones, etc., capable of being repeatedly adhered to and peeled off from the screen.

BACKGROUND ART

Heretofore, a film has been required, which can be suitably used for efficiently covering a protected surface or a surface that needs to be protected.

For example, a surface protection film is proposed, which has weak pressure dependency at the time of adhering, being able to easily adhered (temporarily adhere) to the surface of various materials (objects to be protected) such as metal plate etc. even when the film is pressed with a low pressure, and also showing excellent peelability after the use (for example, Japanese Provisional Patent Publication No. 2001-139898).

In another example, a transparent, electrically conductive and heat sealable material and a carrier tape lid using the same are proposed, which show no lowering in antistatic property even at a low humidity, and have such transparency that contents in the tape lid can be visually recognized (for example, Japanese Provisional Patent Publication No. 2001-348561).

In still another example, a surface protection material is proposed, which has a pressure sensitive adhesive layer on a substrate, showing good initial adhesiveness, small change in adhesive force with time after being adhered and sufficient weather resistance (for example, Japanese Provisional Patent Publication No. 8-245938).

In another example, a self-adhesive elastomer sheet is proposed, which comprises a polymer composition having an epoxidized diene-base block copolymer and a hydrogenated diene-base block copolymer. But residual air problem when the sheet is adhered remains unsolved (for example, Japanese Provisional Patent Publication No. 8-81616).

A recent widespread use of, for example, TV sets with liquid crystal display, TV sets with plasma display panel (PDP), personal computers, mobile-phones, electronic note-pads, etc., is accompanied by a requirement for developing a surface protection film that efficiently protects surfaces thereof to be protected (display screens). Such surface protection film needs to have, for example, such transparency that enables visual recognition of the screen. Adhesiveness (such as adhesive force and workability at the time of adhering) to the surface to be protected and a resistance to environmental causes (for example, scratching or peeling) are also required.

Studies on barrier layers which block or cut off an electromagnetic wave or heat ray leaking from a housing of various electric equipments, have been carried out. In the case of display screens of such as TV sets, personal computers, mobile-phones, etc., antireflective (reflection-reducing), antistatic anticlouding, antibacterial and deodorizing functions are needed besides the electromagnetic wave blocking property. For example, in the case of antireflective, a means of forming of a thin layer of $\lambda/4$ by sputtering of metal or metal oxide is known (Japanese Provisional Patent Publication No. 2003-524197).

In addition, another means is proposed in which a film comprising an adhesive layer and a substrate layer, and having a advertising logo and/or advertising picture thereon, is adhered to a surface of a front glass etc. of various shops, but in such cases, some parts of adhesive layer tends to remain on the surface to be adhered, when peeled off in the case where the layout of the film is changed. Accordingly, wiping out or cleaning of the remaining adhesives is necessary, taking a lot of time and also resulting in lowering in tackiness necessary for re-adhering and resulting in difficulty in applying the film repeatedly to the surface to be adhered.

Furthermore, the surface to be adhered is generally flat, but especially in the case which the surfaces is unevenness, air tends to be trapped in the space between the surface to be adhered and adhesive layer of the film being adhered, resulting in unevenness of the surface of adhered the film and bringing about deterioration in its appearance, durability, etc. In addition, to improve workability, a film capable of being adhered speedily (with good air expelling ability) has also been desired.

As mentioned above, providing such films is desired, that can be easily and repeatedly adhered to and peeled off from a surface be adhered, and that is excellent in appearance and in durability, even which the product to be adhered is made of various materials such as plastics, metals, fibers, glasses, etc. and has a surface of various configuration such as flat, curved, uneven, etc.

DISCLOSURE OF THE INVENTION

Problems to Be Solved by the Invention

An object of the present invention is to provide a self-adhesive film and a self-adhesive functional film which are excellent in air expelling ability when the film is adhered, in transparency, and in adhering workability.

Means to Solve the Problems

Embodiments of the present invention were made to achieve the above mentioned object. In an embodiment, a self-adhesive film comprises a substrate layer and an adhesive layer formed on the substrate layer. The adhesive layer comprises a carboxylic acid-modified thermoplastic elastomer, a carboxylic acid-unmodified thermoplastic elastomer, a crosslinking agent and a plasticizer.

In another embodiment, a self-adhesive film comprises a substrate layer, a first adhesive layer formed on the substrate layer, which comprises a carboxylic acid-modified thermoplastic elastomer and a crosslinking agent, and a second adhesive layer formed on the first adhesive layer, which comprises a carboxylic acid-unmodified thermoplastic elastomer and a plasticizer.

In embodiments, the carboxylic acid-unmodified thermoplastic elastomer comprises a block segment made from styrene monomer unit and a rubber monomer unit.

In embodiments, the plasticizer is naphthenic oil, paraffin oil or a combination thereof.

In embodiments, the plasticizer has a mass-average molecular weight of 100 to 1,000.

In embodiments, a mass ratio of the carboxylic acid-modified thermoplastic elastomer to the crosslinking agent is within the range of 100:1 to 2:1.

In embodiments, the crosslinking agent is an imine-base one.

In embodiments, the substrate layer is a plastic film.

In embodiments, a releasing layer is formed on the adhesive layer or on the second adhesive layer.

In embodiments, the first adhesive layer further comprises an antistatic agent.

In a further embodiment, a self-adhesive functional film comprises:
a substrate layer; an adhesive layer formed on one side of the substrate layer, which comprises a carboxylic acid-modified thermoplastic elastomer, a carboxylic acid-unmodified thermoplastic elastomer, a crosslinking agent and a plasticizer; and a functional layer on the other side of the substrate layer, which has at least one of antireflective, electromagnetic wave shield, heat ray cutting off, antistatic, anticlouding, antibacterial, deodorizing, easy-adhering and antifouling functions and hard coat layer.

In another embodiment, a self-adhesive functional film comprises:
a substrate layer;
a first adhesive layer formed on one side of the substrate layer, which comprises a carboxylic acid-modified thermoplastic elastomer and a crosslinking agent;
a second adhesive layer formed on the first adhesive layer, which comprises a carboxylic acid-unmodified thermoplastic elastomer and a plasticizer; and
a functional layer formed on the other side of the substrate layer, which has at least one of antireflective, electromagnetic wave blocking, heat ray cutting off, antistatic, anticlouding, antibacterial, deodorizing, easy-adhering, antifouling functions and hard coat layer.

In embodiments, the functional layer is a metal- and/or metal oxide-layer formed by sputtering.

Effect of the Invention

The self-adhesive film of the present invention is excellent in air expelling speed and capability of pushing out trapped air when the film is adhered, as well as excellent in transparency, adhering workability, etc., and furthermore is excellent in adhesiveness between the substrate layer and the adhesive layer so that separation between the substrate layer and the adhesive layer is effectively prevented when the adhered film is peeled off from the adhered surface. Furthermore, the film offers good cutting workability when the film is cut with knife, and there is no curling up of the chip from the substrate when the film is cut.

Accordingly, the self-adhesive film of the present invention enables easily and repeatedly adhering to and peeling off from the surface to be adhered which even is made of various materials such as plastics, metals, fibers, glasses, etc, and even has various configuration such as flat, curved, uneven surface, etc. Further, a desired finished surface can be obtained by efficiently preventing air from remaining in the boundary face between the surface to be adhered and the surface of the adhesive surface of the film when the film is adhered.

BEST MODE FOR CARRYING OUT THE INVENTION

The term "self-adhesive" of the present invention means such a property of a film that adherence of the film to a surface to be adhered can be carried out without applying further pressure or heat and also without using any other adhesives and any mechanical means such as thumbtacks, screws, staplers, pegs, wires, etc.

The film of the present invention preferably has, other than the above-mentioned self-adhesive property, at least such another property as flexibility that enables the adherence of the film to be completed by at first adhering on one end of the film to the surface to be adhered and then gradually adhering on the other end thereof. For example, the film of the present invention has preferably such flexibility that the film can intimately adhere to all area, especially to a concave portion, of the surface to be adhered without applying further pressure other than a pressure caused by its own weight of the film even when the surface to be adhered has a non-flat shape such as a uneven shape.

The entire thickness of the self-adhesive film of the present invention can be optionally determined in view of durability and flexibility of the film, but preferably is within the range of, for example, 11 to 450 micro meters, more preferably, 30 to 275 micro meters. In addition, the self-adhesive film of the present invention has preferably such transparency as enabling visual recognition of display screens of such as TV sets, computers, etc. when the surface to be adhered is of these equipment. For example, the film may be transparent and colorless, but may be, in some cases, transparent and colored, or opacity.

As the materials of the surface on which the self-adhesive film of the present invention is adhered, for example, plastics, metals, fibers, glasses, etc. can be exemplified. Shapes of the surfaces to be adhered may be various shapes such as flat, curved, uneven shape, etc. As an actual example of the surface to be adhered, the one of display screens of, for example, TV sets, computers, mobile-phones, electronic notepads, etc. are exemplified.

The self-adhesive film of the present invention can be used as POP (Point-of-purchase) advertisements by adhering it onto glasses at storefronts or can be used as a bar-code label by adhering it onto various product containers.

In the self-adhesive film of present invention, "the substrate layer" has one side to which the adhesive layer which will be described later adheres and the other side that is exposed to the atmosphere, and serves as a protection film for protecting the surface adhered from environmental causes such as scratching, curling up, etc. after the self-adhesive film of the present invention is adhered to the surface to be adhered. A certain level of flexibility is required for the substrate layer but if the above mentioned flexibility is ensured for the film as a whole, it can be said sufficient. In addition, the thickness of the substrate layer can be determined optionally, but preferably is within the range of, for example, 10 to 350 micro meters, more preferably, 25 to 200 micro meters. In the present invention, at least one side, that is one side or both sides of the substrate layer, preferably one side, may be subjected to an easy-adhering treatment such as corona treatment, plasma treatment, blast treatment, etc., preferably corona treatment. But the substrate layer with no surface treatment can also be used.

As materials used for producing the substrate layer (materials for the substrate layer), materials used for a conventional self-adhesive film or surface protection film can be used as far as the characteristics mentioned above for the self-adhesive film is not adversely affected, and is preferably, for example, plastic. As such materials, for example, polyester-base resins such as polyethylene terephthalate (PET), polybutylene terephthalate, etc.; polyolefin; polyamide; polycarbonate; acrylic-base resins; polyvinyl chloride; papers; etc., preferably PET, can be used. As such substrate layer, for example, LUMIRROR 50T60 (no easy-adhering treated film) produced by TORAY Industries Inc., EMBLET 38SC (one side corona treated PET film) produced by UNITIKA Ltd., etc. can be exemplified.

Other additives such as pigments, dyes, antioxidants, deterioration prevention agents, fillers, ultraviolet absorbers, antistatic agents and/or electromagnetic wave shield materials, etc. can be added into the substrate layer as far as the effects of the present invention is not adversely affected.

The adhesive layer of the present invention is a layer that is formed on one side of the substrate layer. As the carboxylic acid-modified thermoplastic elastomer, various materials such as carboxylic acid-modified styrene-base thermoplastic elastomer, etc. can be used. The carboxylic acid modification can be carried out using aliphatic saturated mono-carboxylic acids such as propionic acid, butyric acid, isobutyric acid, valeric acid, isovaleric acid, pivalic acid, lauric acid, myristic acid, palmitic acid, stearic acid, etc.; aliphatic saturated dicarboxylic acids such as succinic acid, glutaric acid, adipic acid, pimelic acid, suberic acid, azelaic acid, etc.; aliphatic unsaturated mono-carboxylic acids such as acrylic acid, propiolic acid, methacrylic acid, crotonic acid, isocrotonic acid, oleic acid, etc.; or aliphatic unsaturated dicarboxylic acids such as maleic acid, fumaric acid, citraconic acid, mesaconic acid, etc. Aliphatic unsaturated dicarboxylic acid-modified products are preferable. Maleic acid-modified products are more preferable.

Such carboxylic acid-modified styrene-base thermoplastic elastomers may be, for example, hydrogenated carboxylic acid-modified styrene-base thermoplastic elastomers or, for example, hydrogenated carboxylic acid-modified styrene-butadiene elastomers. As one of such elastomers, for example, hydrogenated maleic acid-modified styrene-butadiene elastomer (maleic acid-modified SEBS elastomer) can be exemplified. In the case where hydrogenated maleic acid-modified styrene-butadiene elastomer is used as the carboxylic acid-modified thermoplastic elestomers, the melt index of the elastomer is preferably within the range of 2.5 to 25 g/10 min. at 200° C. and 5 kg, more preferably, 3 to 7 g/10 min.

In the present invention, when the hydrogenated carboxylic acid-modified thermoplastic elastomer is used, a hydrogenation ratio of the elastomer is preferably 100% practically. However as far as the effects of the present invention are ensured, the ratio could be less than 100%. Further, when carboxylic acid-modified SEBS is used, a mass ratio of styrene:ethylene+butylene is preferably within the range of 10:90 to 40:60, more preferably 20:80 to 30:70. Further, in the present invention, an acid value of the carboxylic acid-modified thermoplastic elastomer is preferably within the range of 2 to 10. When the acid value is less than 3, transparent and colorless film is able to be obtained, and when the acid value is within the range of 3 to 10, yellowish film is able to be obtained.

As the carboxylic acid-modified thermoplastic elastomer that can be used in the present invention, for example, TUFTEC M1911, M1913, M1943 produced by ASAHI KASEI Co., and KRAYTON FG-1901X produced by KRAYTON POLYMER Co. can be exemplified.

The amount of the carboxylic acid-modified thermoplastic elastomer is preferably, on a mass basis of the adhesive layer, within the range of 10 to 75 mass %, more preferably 20 to 60 mass %.

Various carboxylic acid-unmodified thermoplastic elastomers can be used, but polymers comprising a block segment of styrene monomer unit and rubber monomer unit are preferably used. As such thermoplastic elastomers, for example, SIS, SBS, SEBS, SEPS, SI, SB, SEP, etc., preferably SEBS and SEPS, can be exemplified. For example, when SEBS is used, mass-average molecular weight is preferably within the range of 20,000 to 500,000, more preferably 50,000 to 350,000.

The amount of the carboxylic acid-unmodified thermoplastic elastomer is preferably, on a mass basis of the adhesive layer, within the range of 25 to 90%, more preferably 40 to 80%.

The crosslinking agent is not specifically limited to a certain type. For example, the crosslinking agent can be selected optionally in view of the kind of the carboxylic acid-modified thermoplastic elastomer. For example, CORONATE HL (hexamethylene diisocyanate HDI-TMP adduct) produced by NIPPON POLYURETHANE INDUSTRY Co., Ltd., BXX5134 (aziridine base curing agent) produced by TOYO INK MFG. Co., Ltd. can be used as the crosslinking agent.

The mass ratio of the carboxylic acid-modified thermoplastic elastomer: crosslinking agent is not particularly limited but preferably within the range of 100:1 to 2:1, more preferably 100:1 to 4:1, still more preferably 50:1 to 12:1. Within these ratios, adhesiveness between the adhesive layer and the substrate layer can be made excellent.

The plasticizer is not specifically limited to a certain type. However, a compound with high molecular weight and with higher affinity for rubber phase and lower affinity for styrene unit phase is suitable, when the carboxylic acid-unmodified thermoplastic elastomer having a styrene unit phase and a rubber phase is used. For example, naphthenic oil or paraffin oil can be used as such plasticizer.

As for naphthenic oil, flash point thereof is preferably, for example, within the range of 100 to 300° C., more preferably 150 to 280° C. Pour point thereof is preferably, for example, within the range of −30 to −5° C., more preferably −25 to −10° C. Specific gravity thereof is preferably within the range of 0.83 to 0.87, more preferably 0.837 to 0.868. Carbon number thereof is preferably, for example, within the range of 3 to 8, more preferably 5 to 6. The mass-average molecular weight thereof is preferably within the range of 100 to 1,000, more preferably 150 to 450.

As for paraffin oil, for example, flash point thereof is preferably, for example, within the range of 100 to 300° C., more preferably 150 to 280° C. Pour point thereof is preferably, for example, within the range of −30 to −5° C., more preferably −25 to −10° C. And specific gravity thereof is preferably, for example, within the range of 0.89 to 0.91, more preferably 0.8917 to 0.9065. Carbon number thereof is preferably, for example, within the range of 20 to 35, more preferably 21 to 33. The mass-average molecular weight thereof is preferably within the range of 100 to 1,000, more preferably 150 to 450.

In the present invention, the naphthenic oil and the paraffin oil can be used singly or in combination thereof.

In the present invention, the adhesive layer contains the plasticizer preferably within the range of 24 to 88%, on the mass basis of the adhesive layer, more preferably 36 to 72%.

The mass ratio of the carboxylic acid-unmodified thermoplastic elastomer: plasticizer is not particularly limited but preferably within the range of, for example, 5:95 to 95:5, more preferably 10:90 to 90:10.

The adhesive layer may contain, within an amount exerting no adverse effects, other additives such as pigments, dyes, antioxidants, deterioration prevention agents, fillers, ultraviolet absorbers, antistatic agent and/or electromagnetic wave shield agents, etc. As antistatic agents, for example, ELEGAN 264 wax produced by NOF Corporation can be added, preferably within the range of 0.1 to 3.6 mass %, on a mass basis of the adhesive layer, more preferably 0.6 to 1.8 mass %. Regarding to appearance what is called an "orange peel" can be effectively prevented by using the antistatic agent within such ratio.

In the present invention, the thickness of the adhesive layer can be optionally determined, but preferably within the range of 1 to 100 micro meters, more preferably 5 to 75 micro meters, still more preferably 15 to 50 micro meters, thereby achieving, for example, a desired cost- and process-effective results.

In the present invention, a releasing layer may be formed on the adhesive layer, when needed, which covers the adhesive layer during the self-adhesive film is stored, and is released to make the adhesive layer to be exposed when the film is adhered to a surface to be adhered. As the releasing layer, for example, silicone-treated PET film, silicone-treated paper substrate, polyolefin film, etc. can be used, preferably silicone-treated PET film. Preferably the silicone-treated side is contacted onto the adhesive layer.

In the present invention, the "antireflective layer" may be formed on one side of the substrate layer. Preferably, the antireflective layer comprises a first layer made of an intermediate refractive index material, a second layer made from a high refractive index material and a third layer made of a low refractive index material. As the intermediate refractive index materials, preferably metal oxides made from such as indium, tin, zinc, etc. and their hydrogenated materials are exemplified. As the high refractive index materials, titanium oxide and niobium oxide are exemplified. As the low refractive index material, silicon oxide is exemplified. Preferably, each layer can be formed through deposition using sputtering or multilayer coating method.

The self-adhesive film of the present invention can be produced according to procedures shown below, but not limited to them.

At first, the above-mentioned substrate layer (for example, one side corona treated PET film: 10 to 350 micro meters) is prepared. Next, in order to prepare the material of the adhesive layer, the above mentioned carboxylic acid-modified thermoplastic elastomer is added into a solvent such as toluene and dissolved using a stirrer, obtaining a first solution. Separately, the carboxylic acid-unmodified thermoplastic elastomer and the plasticizer are mixed and then are added into the first solution. Further, the curing agent is added and the antistatic agent is, if necessary, added, then obtaining the coating solution for the adhesive layer.

The thus obtained coating solution for adhesive layer is coated on the corona treated substrate layer. As for a coating method, any coating method can be adopted if the obtained coating solution can be coated. For example, roller coating, brush coating, spray coating, dip coating, etc. and various coating methods using such as die coater, bar coater, knife coater, etc. can be exemplified. Next, the coated layer is dried, under various conditions according to a thickness of the layer or a kind of solvent used, for example, at 80 to 150° C. for 20 to 60 seconds, preferably 100 to 130° C. for 30 to 50 seconds. Thereby, the adhesive layer having a thickness of 1 to 100 micro meters can be formed on the substrate layer. Next, on the adhesive layer, the above-mentioned releasing layer is laminated, if necessary. The self-adhesive film of the present invention can be obtained after aging it at 40 to 80° C. for 2 to 6 days.

Another process to produce the film is that, at first, the above-mentioned substrate layer (for example one side corona treated PET film: 10 to 350 micro meters) is prepared, next, in order to prepare the coating solution for the first adhesive layer, the above-mentioned carboxylic acid-modified thermoplastic elastomer is added into a solvent such as toluene and dissolved using a stirrer, obtaining a solution. The crosslinking agent is added into the solution. Next, the antistatic agent is, if necessary, added, obtaining the coating solution for the first adhesive layer.

The thus obtained coating solution for the first adhesive layer is coated on the corona treated substrate layer. As for a coating method, any coating method can be adopted if the obtained coating solution can be coated. For example, roller coating, brush coating, spray coating, dip coating, etc. and various coating methods using such as die coater, bar coater, knife coater, etc. can be exemplified. Next, the coated layer is dried, under various conditions according to a thickness of the layer or a kind of solvent used, for example, at 80 to 150° C. for 20 to 60 seconds, preferably 100 to 130° C. for 30 to 50 seconds. Thereby, the first adhesive layer having a thickness of 1 to 50 micro meters is formed on the substrate layer.

Next, the material for the second adhesive layer, which contains styrene-butadiene elastomer as the above-mentioned carboxylic acid-unmodified thermoplastic elastomer and the above-mentioned plasticizer in the amount and/or the mass ratio mentioned above, is coated on the first adhesive layer, by, for example, using one of the above-mentioned coating methods. Next, the coated layer is dried, preferably at 80 to 150° C. for 0.5 to 2 min., more preferably at 100 to 130° C. for 40 seconds to 1.5 min., then obtaining the second adhesive layer having a thickness of 10 to 100 micro meters on the first adhesive layer. Next, on the second adhesive layer, the above-mentioned releasing layer is laminated, if necessary. The self-adhesive film of the present invention can be obtained after aging it at 40 to 80° C. for 2 to 6 days.

The present invention will be explained hereunder more specifically with reference to examples, but the scope of the present invention is not limited to those examples.

EXAMPLE 1

17 parts by mass (hereunder abbreviated to "parts") of SEBS thermoplastic elastomer (mass-average molecular weight 200,000) and 83 parts of paraffin oil plasticizer (mass-average molecular weight 330) were dissolved into 233 parts of toluene. To 100 parts of the thus obtained toluene solution, 23 parts of toluene solution containing 16 weight % (hereunder abbreviated to %) of TUFTEC M1911 [by ASAHI KASEI Co., maleic acid-modified SEBS, melt index (200° C., 5 kg) 3.5 g/10 min., mass ratio of styrene:ethylene+butylene 30:70, acid value 2] was added. Further 0.6 parts of CORONATE HL [by NIPPON POLYURETHANE INDUSTRY Co., Ltd., hexamethylene diisocyanate HDI-TMP adduct, solid content 75%] was added, and then 0.1 parts of ELEGAN 264 wax [by NOF Corporation, cationic antistatic agent, solid content 100%], as an antistatic agent for preventing charging at the time the coating material is applied, was added to the liquid mixture, obtaining a coating solution.

The thus obtained coating solution for the adhesive layer was applied on A-4 size LUMIRROR 50T60 [by TORAY INDUSTRIES Inc., untreated PET film, thickness 50 micro meters] as the substrate layer, using a Mayer bar. Then a 15 micro meters thick adhesive layer was formed on the substrate layer after dried at 100° C. for 40 seconds.

Next, a silicone treated PET film as the releasing layer was laminated. A self-adhesive film (product 1 of the present invention) was obtained after aging it at 45° C. for 4 days.

EXAMPLE 2

Except that the amount of toluene solution containing 16% of TUFTEC M1911 was changed to 46 parts and the amount of CORONATE HL was changed to 1.2 parts in Example 1, a self-adhesive film (product 2 of the present invention) was obtained through the same procedure as described in Example 1.

EXAMPLE 3

Except that the amount of toluene solution containing 16% of TUFTEC M1911 was changed to 94 parts and the amount of CORONATE HL was changed to 2.4 parts in Example 1, a self-adhesive film (product 3 of the present invention) was obtained through the same procedure as described in Example 1.

EXAMPLE 4

The average molecular weight (mass average molecular weight) of the paraffin oil was changed to 250 in Example 1. To 100 parts of the thus obtained toluene solution, 28 parts of toluene solution containing 16% of TUFTEC M1911 and 6 parts of BXX5134 (an aziridine type curing agent, solid content 5%, produced by TOYO INK MFG. Co., Ltd.) as a curing agent in place of CORONATE HL were added. And 3.6 parts of TINUVIN 384-2 (by CIBA SPECIALITY CHEMICALS, benzotriazole type ultraviolet absorber) was then added and mixed, and obtaining the coating solution. The coating solution was coated and an adhesive layer having thickness of 25 micro meters was formed on the substrate layer through the same procedure as described in Example 1 except the condition described above. And a self-adhesive film (product 4 of the present invention) was obtained.

EXAMPLE 5

100 parts by weight (hereunder abbreviated to parts) of TUFTEC M1911 [by ASAHI KASEI Co., maleic acid-modified SEBS, melt index (200° C., 5 Kg) 3.5 g/10 min., mass ratio of styrene:ethylene+butylene 30:70, acid value 2] was added to 670 parts of toluene and dissolved with a propeller stirrer (solid content 13%). To 100 parts of the thus obtained toluene solution, 1 part of CORONATE HL [by NIPPON POLYURETHANE INDUSTRY Co., Ltd., hexamethylene diisocyanate HDI-TMP adduct, solid content 75%] was added and mixed at room temperature, obtaining the material for the first adhesive layer.

The obtained coating solution for the first adhesive layer was coated on A-4 size LUMIRROR 50T60 [by TORAY INDUSTRIES Inc., untreated PET film, thickness 50 micro meters] as the substrate layer, using a Mayer bar. A 2 micro meters thick adhesive layer was formed on the substrate layer after dried at 120° C. for 40 seconds.

Next, 17 parts of SEBS thermoplastic elastomer (mass-average molecular weight 200,000) and 83 parts of paraffin oil plasticizer (mass-average molecular weight 250) were dissolved into 233 parts of toluene. To 100 parts of the thus obtained toluene solution, 0.1 parts of ELEGAN 264 wax [by NOF Corporation, cationic antistatic agent, solid content 100%] was added, and further 1 part of TINUVIN 571 [by CIBA SPECIALITY CHEMICALS, benzotriazole-type ultraviolet absorber] and 0.5 parts of TINUVIN 400 [by CIBA SPECIALITY CHEMICALS, hydroxyphenyltriazine-type ultraviolet absorber] were added, obtaining a coating solution.

The thus obtained coating solution for the adhesive layer was coated on the first adhesive layer and dried at 100° C. for 1 min., providing a 35 micro meters thick second adhesive layer on the first adhesive layer. Then the silicone treated PET film, as the releasing layer, was laminated. A self-adhesive film was obtained after aging it at 45° C. for 4 days.

EXAMPLE 6

Except that ANTIREFLECTIVE AR film produced by SOUTHWALLS TECHNOLOGIES Inc. was used, as the substrate layer, in place of LUMIRROR 50T60, the self-adhesive functional film (product 6 of the present invention) was obtained through the same procedure as described in Example 1 by providing the adhesive layer on the side that antireflective layer was not formed.

EXAMPLE 7

Except that ANTIREFLECTIVE AR film produced by SOUTHWALLS TECHNOLOGIES INC. was used, as the substrate layer, in place of LUMIRROR, the self-adhesive functional film (product 7 of the present invention) was obtained through the same procedure as described in Example 5 by providing the first and the second adhesive layers on the side that antireflective layer was not formed.

COMPARATIVE EXAMPLE 1

100 parts of SK DYNE 1499 (by SOKEN CHEMICAL & ENGINEERING Co., Ltd., an acrylic-type adhesive, solid content 30%) and 2.7 parts of L-45 (by SOKEN CHEMICAL & ENGINEERING Co., Ltd., an isocyanate-type curing agent, solid content 45%) were mixed at room temperature. The obtained coating solution was applied on A-4 size LUMIRROR 50T60 (by TORAY INDUCTRIES Inc., untreated PET film) as the substrate layer, using a Mayer bar, so as to make the resin layer have 25 micro meters thickness. A silicone treated PET film was laminated after dried at 100° C. for 1 min. The acrylic-type adhesive sheet was obtained as a Comparative Example.

The above-mentioned adhesive films were subjected to tests described below to determine properties. Test results are shown in Table 1.

(Cutting Test with a Cutter Knife)

The releasing layer was released and then the self-adhesive film was cut in from the adhesive layer side with a cutter knife. Peeling behavior of the adhesive layer peeled from the substrate layer was observed. Rating was carried out according to the following standard.

◯: no peeling from the substrate

Δ: slightly peeled from the substrate but no problem for practical use

X: easily peeled from the substrate and no practical use (Transparency)

Total light transmission and haze value were determined using a hazemeter (by SUGA TEST INSTRUMENTS Co., Ltd.).

(Air Expelling Speed)

Measurement was carried out by loop type air expelling testing. The long sides of the self-adhesive film having a rectangular shape of 150 mm×50 mm were curled up to form a loop shape with its adhesive layer lying outside the loop. Next, the central portion of the loop was contacted with a surface of soda glass plate and then the loop was unhanded. Time period until the whole area of the self-adhesive film contacted with the soda glass plate was measured.

(Workability in Lamination to a Window-Pane)

The releasing layer was released from the self-adhesive film (A-4 size) and an edge of the exposed adhesive layer was adhered to a window-pane (flat surface), then the rest area of the film was gradually adhered spreadly on the window-pane. Workability at this time was rated according to the following standard.

◯: no air was trapped and the film was adhered smoothly

Δ: air was trapped but no problem for practical use

X: large number of air bubbles was trapped and no practical use (Peeling Test)

The self-adhesive films of the above-mentioned Examples were cut into test pieces having a size of 25 mm×150 mm. The releasing layer was released from the adhesive layer and the surface of the adhesive layer was pressed to adhere to a glass plate (soda glass, produced by CENTRAL GLASS Co., Ltd.) with a roller weighing 2 kg. Then, samples of the films adhered to the soda glass was kept at room temperature for 30 min. (initial sample). The other sample of the films adhered to the soda glass was kept in an oven at 80° C. for 30 min. Each 3 test pieces of the same sample was subjected to determine the adhesive force between the adhesive layer and the glass surface, under a peeling angle of 180° and a peeling speed of 300 mm/min, using AUTOGRAPH AGS-50d (product by SHIMADZU CORPORATION). Force required peeled was determined by calculating the average of the force of 3 test pieces of the same sample.

TABLE 1

|  | Example | | | | | | | Comp Ex. |
|---|---|---|---|---|---|---|---|---|
|  | 1 | 2 | 3 | 4 | 5 | 6 | 7 | 1 |
| Thickness of Adhesive Layer (micro meters) | 15 | 15 | 15 | 25 | 37 | 15 | 37 | 25 |
| Cutting Test with a Cutter Knife | ○ | ○ | ○ | ○ | ○ | ○ | ○ | ○ |
| Total Light Transmission (%) | 91.6 | 91.8 | 91.5 | 91.0 | 90.9 | 94.3 | 94.6 | 91.5 |
| Haze Value (%) | 1.8 | 2.3 | 2.6 | 1.2 | 1.5 | 1.2 | 1.0 | 1.5 |
| Air Expelling Speed (second) | 1.7 | 1.7 | 1.5 | 1.9 | 1.1 | 1.6 | 1.0 | 20.3 |
| Workability of Lamination to the Window-pane (water was not used) | ○ | ○ | ○ | ○ | ○ | ○ | ○ | X |
| Stripping Property — Force Required to Peel (N/cm) (soda glass, initial) | 0.015 | 0.019 | 0.026 | 0.004 | 0.002 | 0.012 | 0.002 | 0.041 |
| Force Required to Peel (N/cm) (glass, after aging at 80° C. × 30 min.) | 0.046 | 0.120 | 0.042 | 0.020 | 0.008 | 0.043 | 0.007 | 0.043 |

What is claimed is:

1. A self-adhesive film comprising:
   a substrate layer; and
   an adhesive layer formed on the substrate layer, the adhesive layer consisting of a carboxylic acid-modified thermoplastic elastomer, a carboxylic acid-unmodified thermoplastic elastomer, a crosslinking agent and a plasticizer, wherein the carboxylic acid-unmodified thermoplastic elastomer consists of a block segment made from a styrene monomer unit and a rubber monomer unit.

2. The self-adhesive film according to claim 1, wherein the plasticizer is naphthenic oil, paraffin oil, or a combination thereof.

3. The self-adhesive film according to claim 1, wherein the plasticizer has a mass-average molecular weight of 100 to 1,000.

4. The self-adhesive film according to claim 1, wherein a mass ratio of the carboxylic acid-modified thermoplastic elastomer to the crosslinking agent is within the range of 100:1 to 2:1.

5. The self-adhesive film according to claim 1, wherein the crosslinking agent is an imine-base or an isocyanate.

6. The self-adhesive film according to claim 1, wherein the substrate layer is a plastic film.

7. The self-adhesive film according to claim 1, wherein a releasing layer is laminated on the adhesive layer.

* * * * *